(12) United States Patent
Vergis et al.

(10) Patent No.: US 7,342,411 B2
(45) Date of Patent: Mar. 11, 2008

(54) DYNAMIC ON-DIE TERMINATION LAUNCH LATENCY REDUCTION

(75) Inventors: George Vergis, Hillsboro, OR (US); Christopher Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 11/296,960

(22) Filed: Dec. 7, 2005

(65) Prior Publication Data

US 2007/0126464 A1    Jun. 7, 2007

(51) Int. Cl.
H03K 17/16    (2006.01)
H03K 19/003   (2006.01)

(52) U.S. Cl. .............. 326/30; 326/32; 326/34
(58) Field of Classification Search ......... 326/30–34; 365/233
See application file for complete search history.

(56) References Cited

U.S. PATENT DOCUMENTS

| 6,642,740 | B2 | 11/2003 | Kim et al. |
| 6,894,946 | B2* | 5/2005 | Jang ............................ 365/233 |
| 6,981,089 | B2* | 12/2005 | Dodd et al. ................. 710/308 |
| 2003/0042573 | A1 | 3/2003 | Fan et al. |
| 2005/0154943 | A1 | 7/2005 | Alexander et al. |
| 2007/0046308 | A1 | 3/2007 | Baker et al. |

OTHER PUBLICATIONS

Micron, The Future of Memory: Graphics DDR3 SDRAM Functionality, Designline vol. 11 issue 4, 8 pages.
Micron, Graphics DDR3 On-Die Termination and Thermal Considerations, Designline vol. 12, issue 1, 8 pages.
Micron, DDR2 Offers New Features and Functionality, Designline vol. 12, issue 2, 16 pages.
U.S. Appl. No. 11/171,625; Inventor: Hsien-Pao Yang; filed Jun. 30, 2005.
Office Action dated May 2, 2007 for corresponding U.S. Appl. No. 11/296,950, filed Dec. 7, 2005, to Cox et al.

* cited by examiner

*Primary Examiner*—Anh Q. Tran
(74) *Attorney, Agent, or Firm*—Philip A. Pedigo

(57) ABSTRACT

Embodiments of the invention are generally directed to systems, methods, and apparatuses for dynamic on-die termination launch latency reduction. In some embodiments, an integrated circuit includes an input/output (I/O) circuit to receive a command and a termination resistance circuit to provide a termination resistance for the I/O circuit. The integrated circuit may further include control logic to establish an initial termination resistance during a preamble associated with the command. Other embodiments are described and claimed.

21 Claims, 9 Drawing Sheets

| Config | if the CMD is a | to DIMM | to Rank | Controller | Dynamic ODT DIMM 1 Rank 1 | DIMM 1 Rank 2 | DIMM 2 Rank 1 | DIMM 2 Rank 2 |
|---|---|---|---|---|---|---|---|---|
| 2R/1R | WRITE | 1 | 1 | ∞ | 120 Ω | ∞ | 20 Ω | N/A |
|  | WRITE | 1 | 2 | ∞ | ∞ | 120 Ω | 20 Ω | N/A |
|  | WRITE | 2 | 1 | ∞ | 20 Ω | ∞ | 120 Ω | N/A |
|  | READ | 1 | 1 | 120 Ω | ∞ | ∞ | 20 Ω | N/A |
|  | READ | 1 | 2 | 120 Ω | ∞ | ∞ | 20 Ω | N/A |
|  | READ | 2 | 1 | 120 Ω | 20 Ω | ∞ | ∞ | N/A |

| | | | | | DIMM 1 | | DIMM 2 | |
|---|---|---|---|---|---|---|---|---|
| Config | if the CMD is a | to DIMM | to Rank | Controller Term | Rank 1 | Rank 2 | Rank 1 | Rank 2 |
| 2R/2R | WRITE | 1 | 1 | ∞ | 120Ω | ∞ | 40 Ω | 40Ω |
| | WRITE | 1 | 2 | ∞ | ∞ | 120Ω | 40 Ω | 40Ω |
| | WRITE | 2 | 1 | ∞ | 40 Ω | 40 Ω | 120Ω | ∞ |
| | WRITE | 2 | 2 | ∞ | 40 Ω | 40 Ω | ∞ | 120Ω |
| | READ | 1 | 1 | 120 Ω | ∞ | ∞ | 40 Ω | 40 Ω |
| | READ | 1 | 2 | 120 Ω | ∞ | ∞ | 40 Ω | 40 Ω |
| | READ | 2 | 1 | 120 Ω | 40 Ω | 40 Ω | ∞ | ∞ |
| | READ | 2 | 2 | 120 Ω | 40 Ω | 40 Ω | ∞ | ∞ |

412

| | | | | | DIMM 1 | | DIMM 2 | |
|---|---|---|---|---|---|---|---|---|
| 2R/1R | WRITE | 1 | 1 | ∞ | 120Ω | ∞ | 20 Ω | N/A |
| | WRITE | 1 | 2 | ∞ | ∞ | 120Ω | 20 Ω | N/A |
| | WRITE | 2 | 1 | ∞ | 40Ω | 40 Ω | 120Ω | |
| | READ | 1 | 1 | 120 Ω | ∞ | ∞ | 20 Ω | N/A |
| | READ | 1 | 2 | 120 Ω | ∞ | ∞ | 20 Ω | N/A |
| | READ | 2 | 1 | 120 Ω | 40 Ω | 40 Ω | ∞ | |

414

| | | | | | DIMM 1 | | DIMM 2 | |
|---|---|---|---|---|---|---|---|---|
| 1R/2R | WRITE | 1 | 1 | ∞ | 120Ω | N/A | 40 Ω | 40Ω |
| | WRITE | 2 | 1 | ∞ | 20 Ω | N/A | 120Ω | ∞ |
| | WRITE | 2 | 2 | ∞ | 20 Ω | N/A | ∞ | 120Ω |
| | READ | 1 | 1 | 120 Ω | ∞ | N/A | 40 Ω | 40Ω |
| | READ | 2 | 1 | 120 Ω | 20 Ω | N/A | ∞ | ∞ |
| | READ | 2 | 2 | 120 Ω | 20 Ω | N/A | ∞ | ∞ |

416

| | | | | | DIMM 1 | | DIMM 2 | |
|---|---|---|---|---|---|---|---|---|
| 1R/1R | WRITE | 1 | 1 | ∞ | 120Ω | N/A | 20 Ω | N/A |
| | WRITE | 2 | 1 | ∞ | 20Ω | N/A | 120Ω | N/A |
| | READ | 1 | 1 | 120Ω | ∞ | N/A | 20 Ω | N/A |
| | READ | 2 | 1 | 120Ω | 20Ω | N/A | ∞ | N/A |

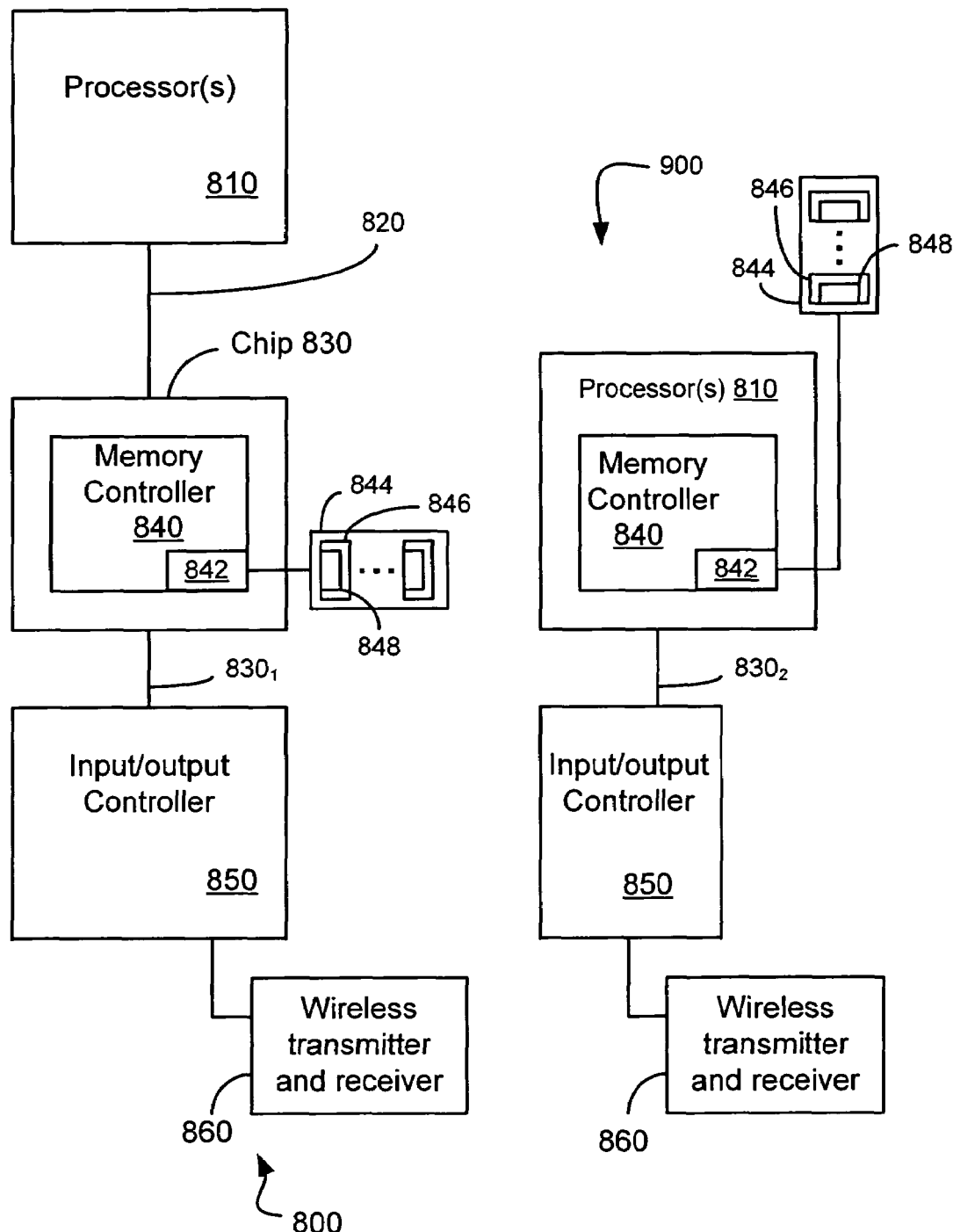

United States Patent
US 7,342,411 B2

DYNAMIC ON-DIE TERMINATION LAUNCH LATENCY REDUCTION

TECHNICAL FIELD

Embodiments of the invention generally relate to the field of integrated circuits and, more particularly, to systems, methods and apparatuses for dynamic on-die termination launch latency reduction.

BACKGROUND

The operating frequencies of integrated circuits such as memory devices are progressively increasing. To take advantage of these high frequencies computing systems are designed to transmit signals along their busses and between system components at comparable frequencies.

Some difficulties may be encountered when transmitting and receiving data between system components (e.g., between integrated circuits) at high frequencies. Buses behave like transmission lines, where impedance mismatches lead to signal reflection and interference effects. Termination resistance can be used to maintain signal quality over interconnections by matching impedances to minimize signal reflections.

Conventional memory systems, such as double data rate (DDR) dynamic random access memory devices (DRAMs) typically have multi-drop bus architectures that are terminated with a resistor that is resident on the motherboard. In other conventional memory systems, the termination resistor is resident on the integrated circuit.

The term "on-die termination (ODT)" refers to termination resistance that is resident on the integrated circuit. In conventional systems, the value of ODT is set when a computing system is initialized. After initialization, the ODT can be activated or deactivated with the value that is set during initialization.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4A is a chart diagram illustrating selected aspects of ODT control logic according to an embodiment of the invention.

FIG. 4B is a chart diagram illustrating selected aspects of an alternative example of ODT control logic according to an embodiment of the invention.

FIGS. 8A and 8B are block diagrams illustrating selected aspects of computing systems.

DETAILED DESCRIPTION

Embodiments of the invention are generally directed to systems, methods, and apparatuses for dynamic on-die termination launch latency reduction. In some embodiments, an integrated circuit includes an input/output (I/O) circuit to receive a command and a termination resistance circuit to dynamically provide one of a plurality of termination resistance for the I/O circuit. The integrated circuit may further include control logic to establish an initial termination resistance during a preamble associated with the command. The initial termination resistance may be established prior to determining a selected on-die termination (ODT) value. In some embodiments, the control logic is capable of directly transitioning the termination resistance circuit from a first selected ODT value to a second selected ODT value. As is further discussed below, the preamble and/or transition functions of the control logic may reduce ODT launch latency.

Figure 1:
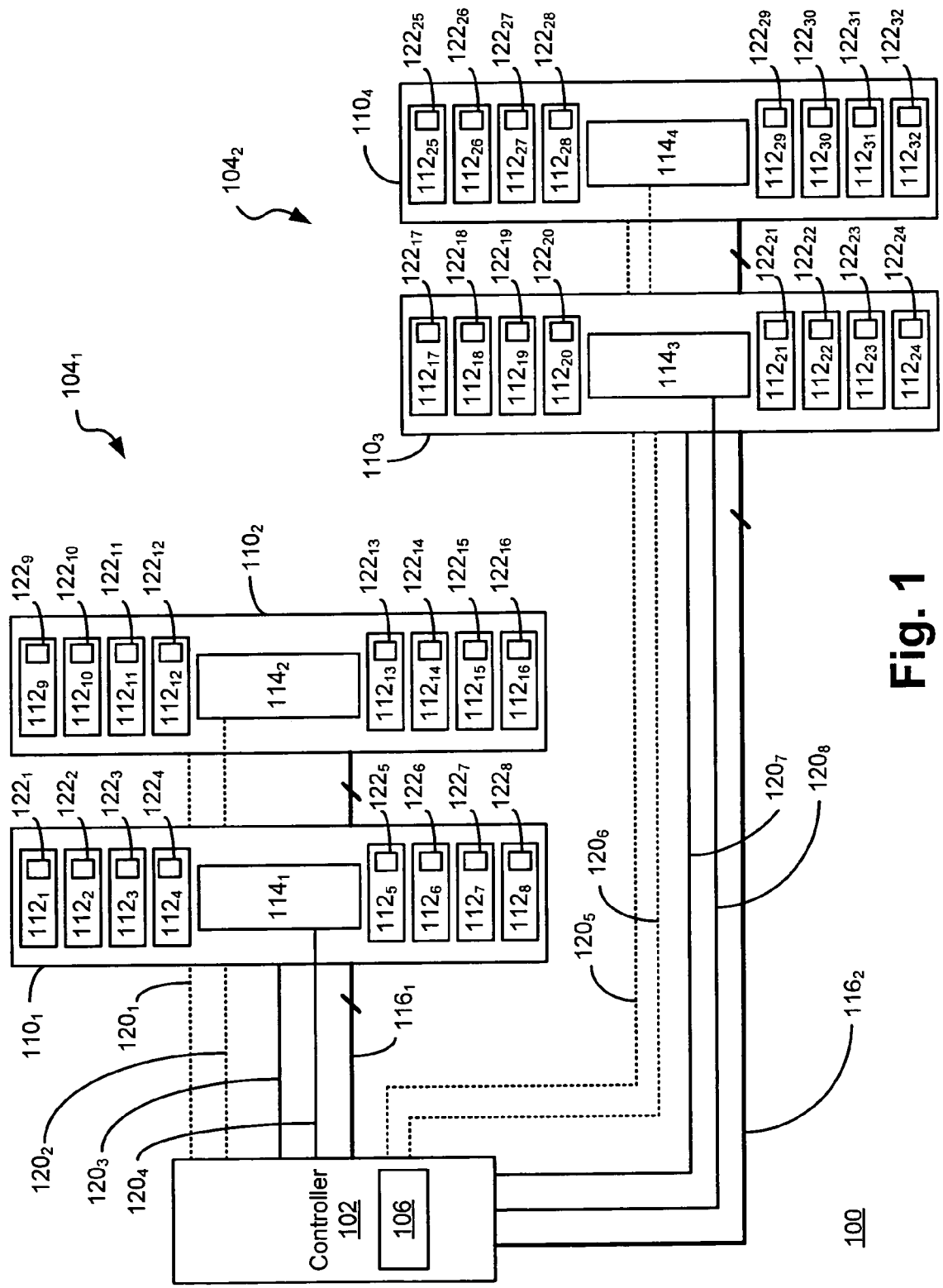
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. Computing system 100 includes controller 102 and two memory channels 104. Controller 102 may be any type of controller suitable for controlling, at least in part, the transfer of information between a processor (not shown) and one or more integrated circuits (e.g., memory devices). In some embodiments, controller 102 is a memory controller. Controller 102 includes on-die termination (ODT) control logic 106. As is further described below, in an embodiment, ODT control logic 106 determines an appropriate ODT value for one or more of the integrated circuits in system 100.

Memory channels 104 include memory modules 110 each having, for example, two ranks of memory devices (e.g., one on either side). Memory modules 110 may be based on printed circuit boards having fingers along both sides of one edge to create a dual inline memory module (DIMM) that may be plugged into a connector on another circuit board that holds other components of the system. Modules 110 are populated with memory devices 112. The memory devices may be commodity-type dynamic random access memory (DRAM) such as double data rate (DDR) DRAM. In an embodiment, each module 110 includes two ranks (e.g., one on each side of the module). Registers 114 may receive and store information for a corresponding rank.

In an embodiment, controller 102 is coupled with modules 110 via interconnect 116. Interconnect 116 may include an arbitrary number of data lines, address lines, chip select lines and/or other lines. In addition, memory controller 102 is coupled with each rank via on-die termination (ODT) lines 120. In an embodiment, ODT lines 120 provide ODT activation signals for memory devices 112. An ODT activation signal refers to a signal that activates ODT for an integrated circuit or a group of integrated circuits. As is further discussed below, ODT lines 120 may also provide an ODT value selection signal for memory devices 112. An ODT value selection signal refers to a signal that indicates a desired ODT value. In some embodiments, the ODT activation signal activates ODT for an entire rank of memory devices 112. Similarly, in some embodiments, the ODT value selection signal selects an ODT value for an entire rank of memory devices 112. In such embodiments, the ODT pins for the memory devices within a rank may be daisy-chained together so that the same ODT signals (e.g., ODT activation signals and ODT value selection signals) are routed to the memory devices within the rank.

The number of memory channels, memory modules, and memory devices shown in FIG. 1 are for illustrative purposes. An embodiment of the invention may have a different number of memory channels, a different number of memory modules, and/or a different number of memory devices. In addition, the topology and architecture illustrated in FIG. 1 are for illustrative purposes. An embodiment of the invention may have a different topology and/or different architectural features.

Figure 2:
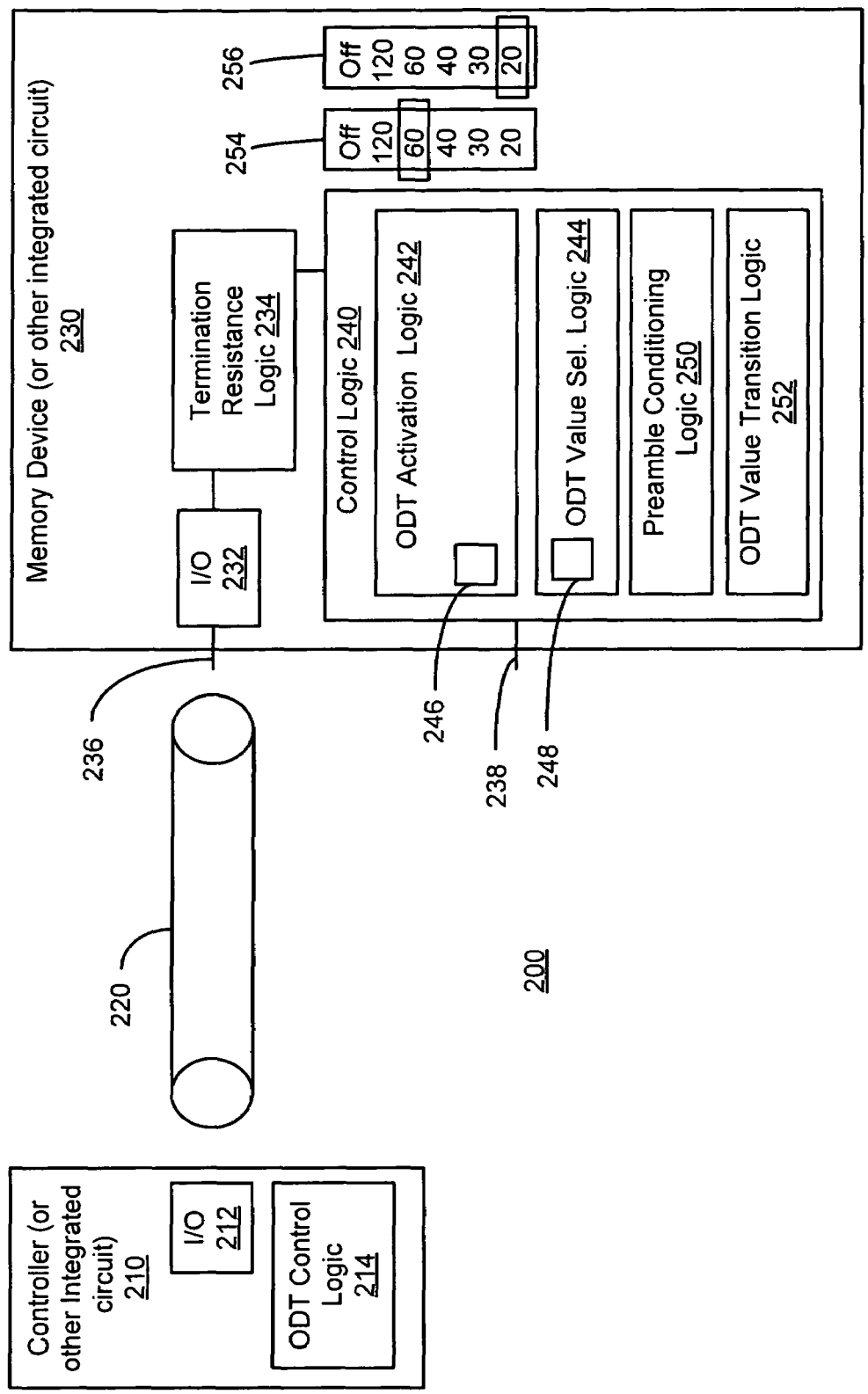
FIG. 2 is a block diagram illustrating selected aspects of a computing system implemented according to an embodiment of the invention.

FIG. 2 is a block diagram illustrating selected aspects of a computing system implemented according to an embodiment of the invention. Computing system 200 includes memory controller 210 and memory device 230 coupled together by interconnect 220. In some embodiments, memory controller 210 is part of the chipset for computing system 200 and memory device 230 is part of the memory subsystem for computing system 200. Memory device 230 may be a DRAM such as a DDR3 synchronous DRAM (SDRAM). Interconnect 220 broadly represents, for example, a number of different data lines, address lines, control lines, and the like.

Memory controller 210 includes input/output (I/O) circuit 212 and ODT control logic 214. I/O circuit 212 can be any I/O circuit suitable for transmitting and receiving information (e.g., data, ODT signals, addresses, etc.) with memory device 230. In some embodiments, ODT control logic 214 determines the appropriate ODT value for memory controller 210 and/or memory device 230. For example, ODT control logic 214 may dynamically determine an appropriate ODT value for memory controller 210 and/or memory device 230 during both read and write operations. ODT control logic 214 is further discussed below in FIGS. 4A and 4B.

Memory device 230 includes I/O circuit 232, termination resistance logic 234 and control logic 240. I/O circuit 232 may be any I/O circuit suitable for transmitting and receiving information (e.g., data, ODT signals, addresses, etc.) with memory controller 210. In some embodiments, termination resistance logic 234 includes a plurality of termination legs that can be selectively activated to dynamically provide a plurality of termination resistances for I/O circuit 232.

Memory device 230 is coupled to interconnect 220 through a plurality of pins including, for example, pins 236 and 238. The term "pin" broadly refers to an electrical interconnection for an integrated circuit (e.g., a pad or other electrical contact on the integrated circuit). For ease of description, FIG. 2 illustrates an individual pin 236 but it is to be appreciated that, typically, a plurality of pins are used to convey data, addresses, commands (e.g., read/write pins), and the like. In an embodiment, pin 238 is an ODT pin. An ODT pin refers to a pin that, in some conventional systems, receives an ODT activation signal.

Control logic 240 includes preamble conditioning logic 250. In some embodiments, preamble conditioning logic 250 is capable of activating the ODT with an arbitrary termination value to, for example, establish a direct current (DC) bias on, for example, interconnect 220 prior to determining a "proper" (e.g., selected) ODT value. The ODT can then be established with the "proper" ODT value just prior to data transfer. In essence, the establishment of the "proper" ODT value can be delayed until the actual data transfer cycle (when the "proper" ODT value helps to provide good signal integrity for the transfer of data). In some embodiments, this delay affords memory device 230 extra time to establish the "proper" ODT value. The term "proper" broadly refers to an ODT value that is selected for memory device 230 by, for example, memory controller 210.

Some conventional DRAM ODT protocols specify a dummy crossing of one clock period during which the ODT is to be activated. Typically, any ODT value is sufficient, during this period, to establish a DC bias on the interconnect. In some embodiments, the "proper" ODT value is established toward the end of the dummy cycle to provide an additional clock cycle to establish the "proper" ODT value. The dummy crossing allows the memory device interconnect (e.g., interconnect 220) to transition from a high impedance state to valid voltage level which may signal the start of a write cycle. In some embodiments, no data is transferred during this period which alleviates the need to establish a "proper" ODT value during this cycle.

Control logic 240 may also include ODT value transition logic 252. In some embodiments, ODT value transition logic 252 is capable of directly transitioning termination resistance logic 234 from a first selected ODT value to a second selected ODT value. For example, ODT value transition logic 252 may activate or deactivate the legs of termination resistance logic 234, as necessary, to directly transition between ODT values without deactivating (e.g., switching off or powering down) termination resistance logic 234.

Conventional memory devices typically use the parameters tAOF (time to turn the termination resistance off) and tAON (time to turn the termination resistance on) to indicate the latency incurred when turning the legs of a termination resistance circuit (e.g., termination resistance logic 234) off and on. In some embodiments, a new parameter may be used to indicate a direct transition from one selected ODT value to another selected ODT value. For example, the parameter "tAONCG" (e.g., time to change the ODT value) may be used to indicate a direct transition without powering down the legs of termination resistance logic 234. In many cases, tAONCG is less than either tAOF or tAON because the delta for a transition between two values is generally less than the delta between zero and a selected ODT value. In some embodiments, the direct transition between selected ODT values may save approximately one-half of a clock per command.

In some embodiments, preamble conditioning logic 250 and ODT value transition logic 252 each provide a reduced latency of approximately half of a clock per command. This reduction in latency may allow for a corresponding reduction in command spacing. For example, a conventional memory system may support a command spacing of tCCD+3 whereas embodiments of the invention may support a command spacing of tCCD+2.

In some embodiments, control logic 240 enables two or more signals to be multiplexed (e.g., time multiplexed) on ODT pin 238. For example, in some embodiments, control logic 240 enables an ODT activation signal and an ODT value selection signal to be multiplexed on ODT pin 238. In such embodiments, control logic 240 may recognize and latch each of the different signals that are multiplexed on ODT pin 238. The latch(es) may stay set for a defined period of time (e.g., a certain number of clock cycles) to deny a reset of the state of the latches by, for example, controller 210. After the defined length of time, control logic 240 may allow a reset of the state to return control of the ODT pin to controller 210.

In some embodiments, control logic 240 includes ODT activation logic 242 and ODT value selection logic 244. ODT activation logic 242 detects an ODT activation signal on ODT pin 238 and activates termination resistance logic 234 responsive to receiving the ODT activation signal. In some embodiments, ODT activation logic 242 includes latch 246. Latch 246 recognizes and latches ODT activation signals that are received on ODT pin 238. Latch 246 may stay set for a defined period of time after it detects an ODT activation signal. For example, in some embodiments, latch 246 stays set for two clock cycles after it detects an ODT activation signal. Since latch 246 stays set for a defined length of time, additional signals (e.g., an ODT value selection signal) may be received on ODT pin 238 without resetting the ODT activation signal. In some embodiments, the period of time that latch 246 stays set may be configurable (e.g., by setting a value in a value in a register).

ODT value selection logic 244 detects an ODT value selection signal on ODT pin 238 and then sets the resistance level of termination resistance logic 234 based (at least partly) on the received ODT value selection signal. In some embodiments, registers 254 and 256 are configured, respectively, with a primary and a secondary ODT value during, for example, system initialization. In the illustrated embodiment, for example, register 254 has been configured to have an ODT value of 60 Ohms and register 256 has been configured to have an ODT value of 20 Ohms. In such embodiments, ODT value selection logic 244 selects an ODT value from either register 254 or 256 based on the received ODT value selection signal. For example, if the ODT value selection signal is high (logically), then ODT value selection logic 244 may select a value from register 254. Similarly, if the ODT value selection signal is low, then ODT value selection logic 244 may select a value from register 256. In some embodiments, ODT value selection logic 244 includes latch 248. Latch 248 recognizes and latches ODT value selection signals that are received on ODT pin 238. Latch 248 may stay set for a defined period of time after it detects an ODT value selection signal.

Figure 3:
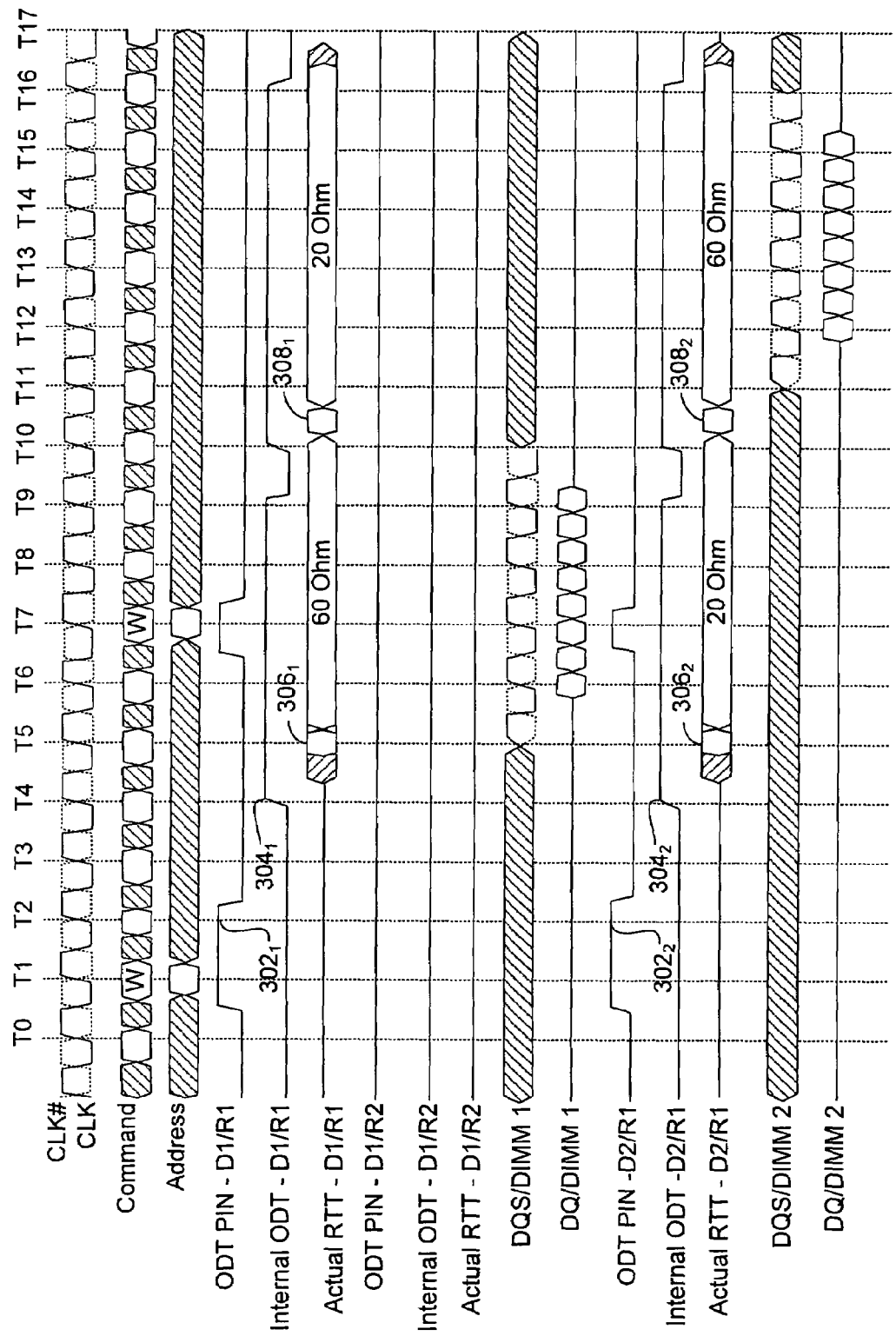
FIG. 3 is a timing diagram illustrating selected aspects of on-die termination (ODT) launch latency reduction, according to an embodiment of the invention.

FIG. 3 is a timing diagram illustrating selected aspects of on-die termination (ODT) launch latency reduction, according to an embodiment of the invention. The timing diagram illustrates back to back writes (e.g., DIMM to DIMM) for a memory system having a 2R/1R configuration. The first write is to DIMM 1, Rank 1 (D1/R1) and the second write is to D2/R1. As is further described below, in some embodiments, a DRAM reduces launch latency by using an initial termination with an arbitrary value and/or by directly transitioning between selected ODT values.

In some embodiments, a DRAM establishes an initial termination resistance prior to, for example, decoding a value selection signal received from a memory controller. Referring to T1, for example, D1/R1 receives a write command. In the illustrated embodiment, D1/R1 and D2/R1 receive an ODT value selection signal at T2 (e.g., 302). In general, there is a latency associated with decoding the received ODT value selection signal to determine a selected ODT value. For example, in some embodiments, the delay in determining a selected ODT value is approximately three clock cycles (or, for ease of reference, three clocks). In some embodiments, D1/R1 and D2/R1 launch the ODT responsive to receiving the command but prior to decoding the received ODT value signal. For example, in the illustrated embodiment, D1/R1 and D2/R1 launch the ODT at T4 (e.g., 304) even though the received ODT value selection signal may not be decoded until (approximately) T5. Reference number 306 illustrates the establishment of the initial termination resistance. In some embodiments, the actual value of the initial termination resistance is not important because the purpose of the initial termination resistance is to provide a DC bias on the interconnect during (at least a portion of) the preamble. Thus, a wide range of schemes may be used to select the initial termination resistance (e.g., turn on any two legs, most recent selected ODT value, a default ODT value, etc.).

In some embodiments, a DRAM directly transitions between selected ODT values. For example, in the illustrated embodiment, D1/R1 directly transitions from a first selected ODT value (e.g., 60 Ohms) to a second selected ODT value (e.g., 20 Ohms) as shown by $308_1$. Similarly, D2/R1 directly transitions from 20 Ohms to 60 Ohms as shown by $308_2$. The term "selected ODT value" refers to an ODT value that is determined (e.g., decoded) from an ODT value selection signal. The term "directly transitions" may refer to transitioning between ODT values without deactivating (e.g., powering down) the associated termination resistance logic.

Some embodiments of the invention support dynamic ODT without adding new pins to a DRAM by time multiplexing the signals received on the ODT pin. Since the ODT value for each rank of memory can be dynamically selected, there is improved balance in termination of the memory channel. For example, FIG. 3 illustrates back-to-back writes to D1/R1 and D2/R1. The ODT value for D1/R1 is dynamically set to 60 Ohms when the memory controller is writing to D1/R1 and 20 Ohms when the memory controller is writing to D2/R1. Similarly, the ODT value for D2/R1 is dynamically set to 20 Ohms when the memory controller is writing to D1/R1 and 60 Ohms when the memory controller is writing to D2/R1.

FIG. 4A is a chart diagram illustrating selected aspects of ODT control logic, according to an embodiment of the invention. The ODT control logic illustrated in chart 400 may be used by a memory controller to dynamically set the appropriate ODT values according to an embodiment of the invention. It is to be appreciated that the configuration and the values shown in FIG. 4A are selected for the purposes of illustration. Embodiments of the invention may have a different configuration and/or have different values than those shown in FIG. 4A. In the illustrated embodiment, the memory system includes two dual inline memory modules (DIMMs) which are designated: DIMM 1 and DIMM 2. DIMM 1 has two ranks of memory devices and DIMM 2 has one rank of memory devices. Each row in chart 400 shows a command and the ODT values associated with the command. Using row 402 as an example, if the memory controller issues a write command to DIMM 1, Rank 1 (D1/R1), then the controller's termination is set to infinity (e.g., off) and the ODT value for D1/R1 is 120 Ohms. In addition, the ODT value for D1/R2 is infinity and D2/R1 is set to 20 Ohms. The remaining rows in chart 400 illustrate examples of appropriate ODT values for read and write commands to various combinations of DIMMs and Ranks, according to an embodiment of the invention.

FIG. 4B is a chart diagram illustrating selected aspects of an alternative example of ODT control logic according to an embodiment of the invention. Chart 410 illustrates an example in which a memory controller dynamically controls the ODT for two memory channels each having two DIMMs. The ODT values for the first memory channel are illustrated by 412 and 414. The ODT values for the second memory channel are illustrated by 416 and 418. It is to be appreciated that the configurations and/or the values shown in FIG. 4B are selected for the purposes of illustration.

Embodiments of the invention may include different configurations and/or different ODT values.

Figure 5:
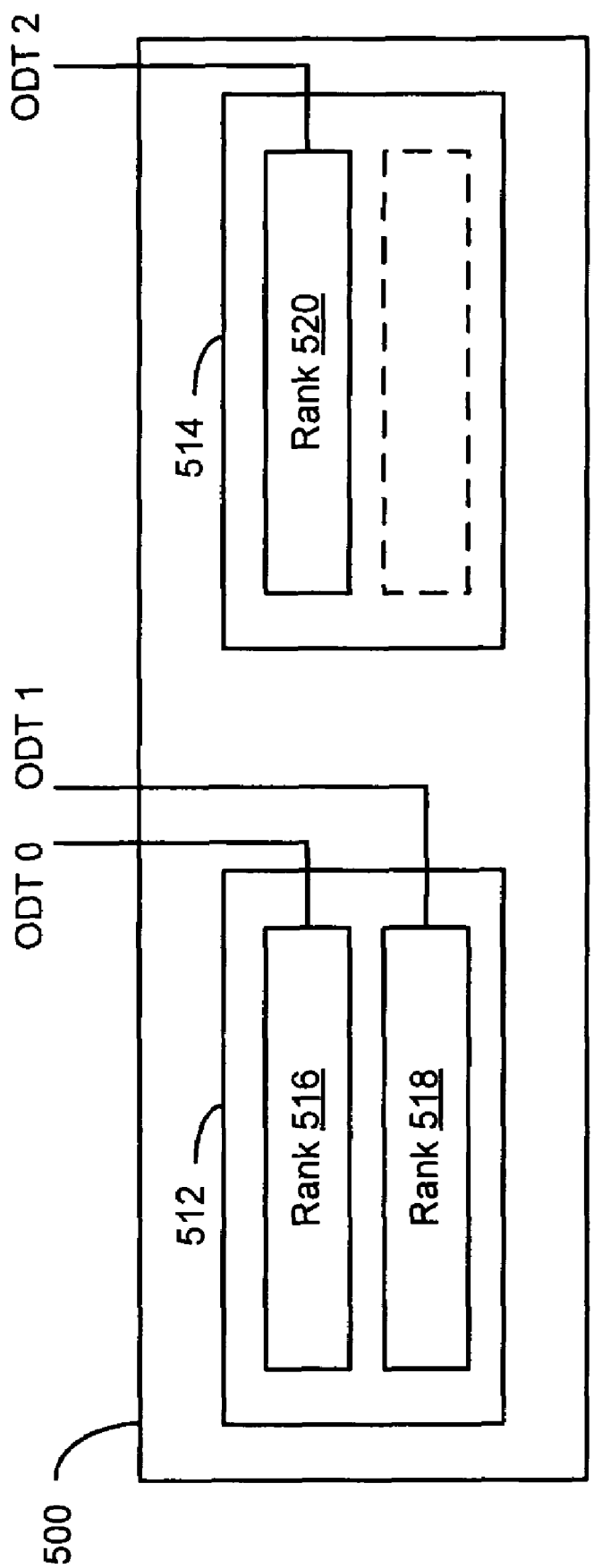
FIG. 5 is a block diagram illustrating selected aspects of balancing termination within a memory system, according to an embodiment of the invention.

FIG. 5 is a block diagram illustrating selected aspects of balancing termination within a memory system, according to an embodiment of the invention. Memory system 500 includes memory modules (e.g., DIMMs) 512 and 514. Module 512 includes ranks 516-518 and module 514 includes rank 520. Thus, memory system 500 has a 2R/1R configuration. It is to be appreciated that the illustrated configuration is merely for the purposes of illustration and embodiments of the invention may have a wide variety of configurations. Each of the illustrated ranks includes a plurality of memory devices (e.g., DRAMs). In some embodiments, each memory device includes a first register to hold a first ODT value and a second register to hold a second ODT value. The memory devices within a given rank may store the same values in their respective registers. Thus, all of the memory devices in rank 516, for example, may be configured with a first ODT value in their respective first registers and a second ODT value in their respective second registers.

In an embodiment, the memory devices in ranks 516 and 518 are configured to store an ODT value of 120 Ohms in a first register and 40 Ohms in a second register. The memory devices in rank 520 are configured to store a value of 120 Ohms in a first register and 20 Ohms in a second register. In such an embodiment, the effective resistance for either module 512 or module 514 may appear to be substantially equal to 20 Ohms. It is to be appreciated that, in practice, embodiments of the invention may include a wide variety of configurations and/or a wide variety ODT values.

Figure 6:
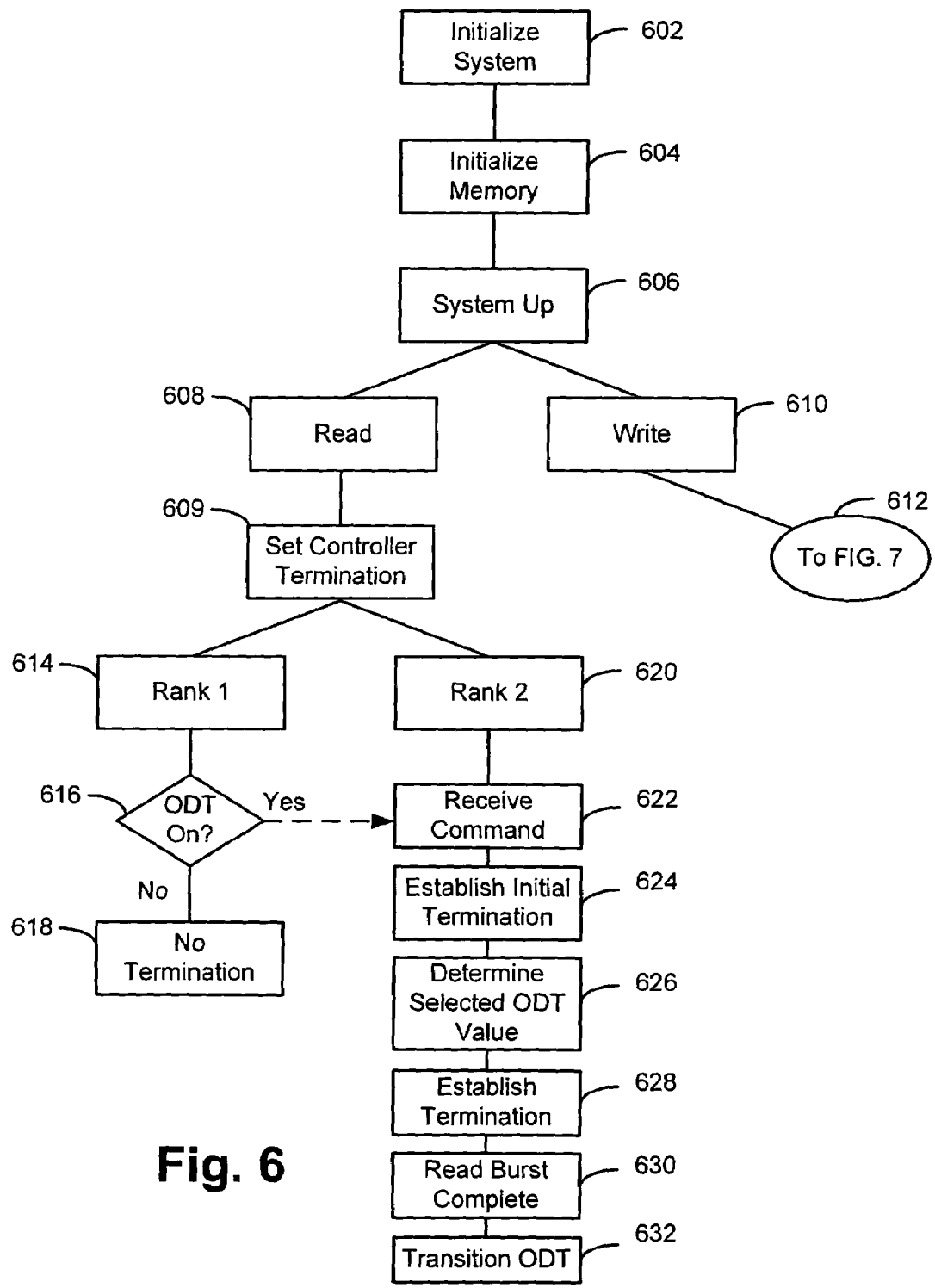
FIG. 6 is a flow diagram illustrating selected aspects of a method for reading from a memory device having ODT implemented according to an embodiment of the invention.

FIG. 6 is a flow diagram illustrating selected aspects of a method for reading from a memory device having on-die termination (ODT) implemented according to an embodiment of the invention. A computing system is initialized at 602. Initializing the computing system may include booting the system, powering-up the system from a low power state, resetting the system (or a portion of the system), and the like.

Referring to process block 604, aspects of the computing system's memory are initialized. In some embodiments, the computing system's basic input/output system (BIOS) manages aspects of the initialization. In other embodiments, the computing system's memory controller manages aspects of the initialization process. The initialization process may include setting ODT values in one or more registers of each memory device within the memory system. For example, for each memory device, a first ODT value may be set in a first register and a second ODT value may be set in a second register.

After the initialization process, the computing system may read and write data to the memory system as shown by 606. If the memory controller issues a write command (610), then the process flow continues in FIG. 7 as shown by 612. Alternatively, if the memory controller issues a read command, then the process flow continues at 608. In some embodiments, the ODT of the memory controller may be set to an appropriate value prior to reading data from a rank of memory as shown by 609. In the illustrated example, there are two ranks (respectively shown by 614 and 620) and the read command may be directed to either rank. For ease of description, the process flow shown in FIG. 6 follows the case in which the read command is directed to rank 2. Thus, the ODT for rank 1 may (but is not required to) be deactivated so that rank 1 has no termination as shown by 616 and 618 respectively. It is to be appreciated that the process flow for reading from rank 1 may be substantially similar to the process flow for reading from rank 2.

Referring to process block 622, rank 2 receives a read command from, for example, a memory controller. In some embodiments, the memory devices within rank 2 establish an initial termination resistance as shown by 624. The memory devices may determine a selected ODT value subsequent to establishing the initial termination resistance as shown by 626. The selected ODT value may be determined by, for example, decoding an ODT value selection signal received from the memory controller.

Referring to process block 628, the memory devices establish the "proper" level of termination. Establishing the "proper" level of termination broadly refers to establishing a level of termination resistance based, at least in part, on the selected ODT value. The memory controller reads a burst of data from rank 2 as shown by 630. In some embodiments, the memory devices directly transition from the ODT value determined at process block 626 to another ODT value as shown by 632. For example, in some embodiments, the memory devices may transition between the ODT values without powering down (or otherwise deactivating) their respective termination resistance circuits.

Figure 7:
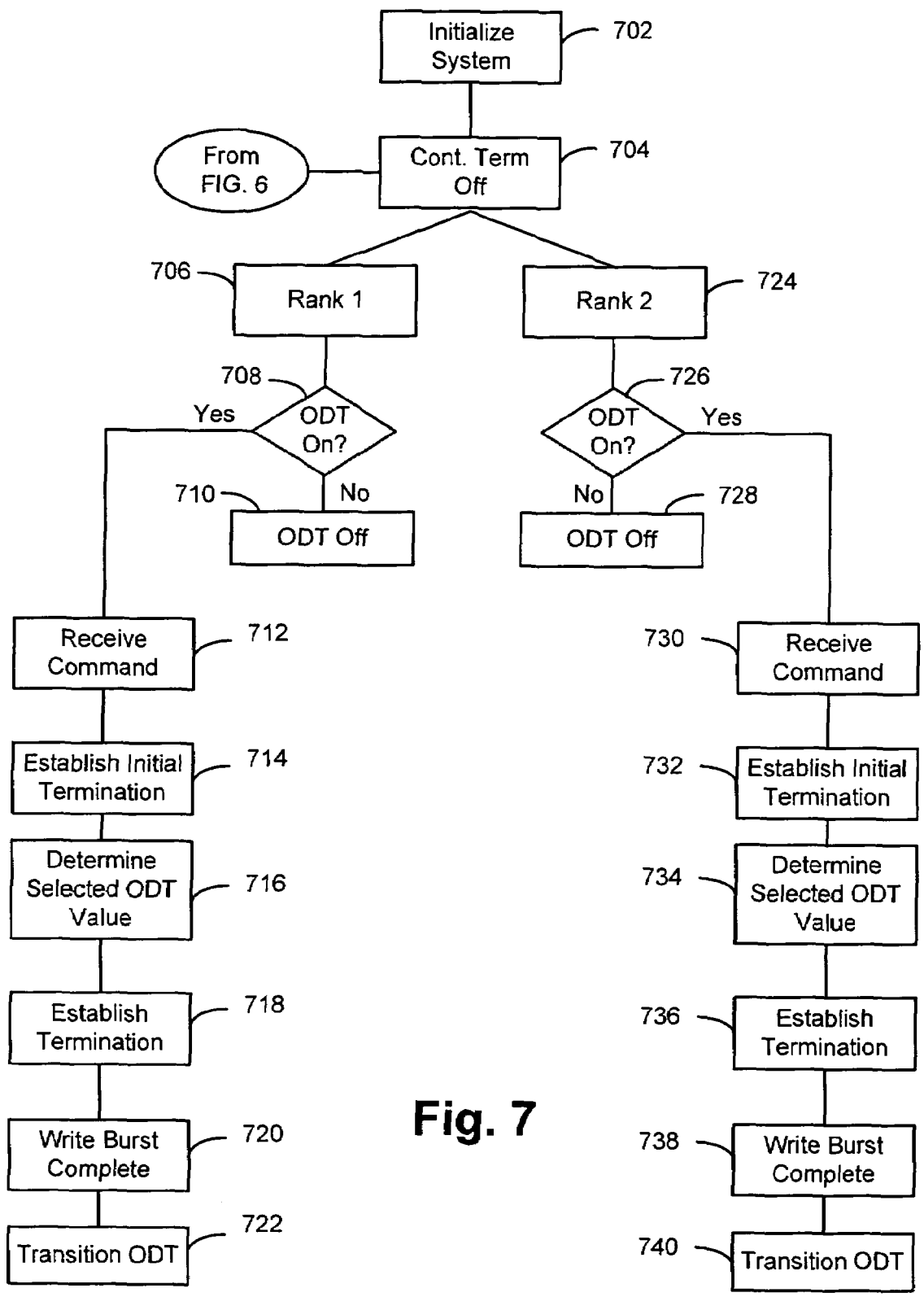
FIG. 7 is a flow diagram illustrating selected aspects of a method for writing to a memory device having ODT implemented according to an embodiment of the invention.

FIG. 7 is a flow diagram illustrating selected aspects of a method for writing to a memory device having on-die termination (ODT) implemented according to an embodiment of the invention. Referring to process block 702, the system is initialized. Initializing the computing system may include booting the system, powering-up the system from a low power state, resetting the system (or a portion of the system), and the like. In some embodiments, the ODT of the memory controller may be deactivated prior to writing data to a rank of memory. In alternative embodiments, the ODT of the memory controller may be set to an appropriate value prior to writing data to the rank of memory.

For ease of description, the embodiment illustrated in FIG. 7 includes two ranks as shown, respectively, by reference numbers 706 and 724. It is to be appreciated, however, that embodiments of the invention may have more ranks of memory or fewer ranks of memory. For ease of description, the process flow associated with writing to rank 1 is described below. It is to be appreciated that the process flow for writing to rank 2 may be substantially the same as the process flow for writing to rank 1.

Referring to process block 708, the memory controller determines whether to activate the ODT for rank 2. For example, the memory controller may implement ODT control logic to determine whether and when to activate ODT for one or more ranks of memory. If the memory controller decides to not use ODT, then it may deactivate the ODT for rank 2, as shown by 710.

Referring to process block 712, rank 1 receives a write command from the memory controller. In some embodiments, the memory devices within rank 1 establish an initial termination resistance as shown by 714. The memory devices may determine a selected ODT value subsequent to establishing the initial termination resistance as shown by 716. The selected ODT value may be determined by, for example, decoding an ODT value signal received from the memory controller. The memory devices establish a "proper" level of termination (e.g., based on the selected ODT value) at 718.

Referring to process block 720, the memory controller writes a burst of data to rank 1. Subsequent to the write burst, rank 1 may transition to a different ODT value (e.g., if it receives a new command from the memory controller). In some embodiments, the memory devices of rank 1 directly transition from the ODT value determined at process block 716 to another ODT value (e.g., based on a new command)

as shown by 722. For example, the memory devices may transition between the ODT values without powering down (or otherwise deactivating) their respective termination resistance circuits. Process blocks 726-740 illustrate aspects of the process flow for writing to rank 2. This process flow is not described in further detail because it is substantially the same as the process flow for writing to rank 1.

FIGS. 8A and 8B are block diagrams illustrating, respectively, selected aspects of computing systems 800 and 900. Computing system 800 includes processor 810 coupled with an interconnect 820. In some embodiments, the term processor and central processing unit (CPU) may be used interchangeably. In one embodiment, processor 810 is a processor in the XEON® family of processors available from Intel Corporation of Santa Clara, Calif. In an alternative embodiment, other processors may be used. In yet another alternative embodiment, processor 810 may include multiple processor cores.

In one embodiment, chip 830 is a component of a chipset. Interconnect 820 may be a point-to-point interconnect or it may be connected to two or more chips (e.g., of the chipset). Chip 830 includes memory controller 840 which may be coupled with main system memory (e.g., as shown in FIG. 1). In an alternative embodiment, memory controller 840 may be on the same chip as processor 810 as shown in FIG. 8B.

Memory system 844 may provide main memory for computing system 800 (and computing system 900). In some embodiments, each memory device 846 within memory system 844 includes control logic 848. Control logic 848 may enable memory device 846 to establish an initial termination resistance for memory device 846. Control logic 848 may also enable memory device 846 to directly transition between different ODT values. In addition, memory controller 840 may include ODT control logic 842. In some embodiments, ODT control logic 842 enables memory controller 840 to determine an appropriate ODT value for the memory devices in memory system 844.

Input/output (I/O) controller 850 controls the flow of data between processor 810 and one or more I/O interfaces (e.g., wired and wireless network interfaces) and/or I/O devices. For example, in the illustrated embodiment, I/O controller 850 controls the flow of data between processor 810 and wireless transmitter and receiver 860. In an alternative embodiment, memory controller 840 and I/O controller 850 may be integrated into a single controller.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
   an input/output (I/O) circuit to receive a command from an interconnect;
   a termination resistance circuit coupled with the I/O circuit, the termination resistance circuit to dynamically provide one of a plurality of termination resistances for the I/O circuit; and
   control logic coupled with the termination resistance circuit, the control logic including preamble conditioning logic to establish an initial termination resistance during a preamble associated with the command, wherein the control logic further comprises ODT value transition logic to directly transition the termination resistance circuit from a first selected ODT value to a second selected ODT value.

2. The integrated circuit of claim 1, wherein the preamble conditioning logic is to establish the initial termination resistance prior to determining a selected on-die termination (ODT) value.

3. The integrated circuit of claim 2, wherein the initial termination resistance is independent of the selected ODT value.

4. The integrated circuit of claim 1, wherein the ODT value transition logic is to directly transition the termination resistance circuit from the first selected ODT value to the second selected ODT value without deactivating the termination resistance circuit.

5. The integrated circuit of claim 4, further comprising:
   an ODT pin to be coupled to the interconnect;
   ODT activation logic coupled with the ODT pin, the ODT activation logic to detect, during a first clock, an ODT activation signal on the ODT pin; and
   ODT value selection logic coupled with the ODT pin, the ODT value selection logic to detect, during a second clock, an ODT value selection signal on the ODT pin and to determine a selected ODT value based, at least in part, on the ODT value selection signal.

6. The integrated circuit of claim 5, wherein the control logic is to prevent a reset of a state of the ODT activation signal for a predetermined period of time to enable a time multiplexing of signals on the ODT pin.

7. The integrated circuit of claim 6, further comprising:
   a first register to contain a first selected ODT value; and
   a second register to contain a second selected ODT value.

8. The integrated circuit of claim 1, wherein the integrated circuit comprises a memory device.

9. The integrated circuit of claim 8, wherein the memory device comprises a dynamic random access memory device (DRAM).

10. A method comprising:
receiving a command, from an interconnect, at an integrated circuit, wherein the integrated circuit includes a termination resistance circuit to dynamically provide one of a plurality of termination resistances for the integrated circuit;
establishing an initial termination resistance during a preamble associated with the command; and
transitioning directly from a first selected ODT value to a second selected ODT value.

11. The method of claim 10, wherein establishing the initial termination resistance on at least a portion of the interconnect comprises:
establishing the initial termination resistance prior to determining a selected on-die termination (ODT) value.

12. The method of claim 11, wherein the initial termination resistance is independent of the selected ODT value.

13. The method of claim 10, wherein transitioning directly from the first selected ODT value to the second selected ODT value comprises:
transitioning directly from the first selected ODT value to the second selected ODT value without deactivating the termination resistance circuit.

14. The method of claim 10, further comprising:
receiving, at a first clock, an on-die termination (ODT) activation signal on an ODT pin of an integrated circuit;
receiving, at a second clock, an ODT value selection signal on the ODT pin of the integrated circuit; and
determining a selected ODT value responsive, at least in part, to receiving the ODT value selection signal.

15. The method of claim 14, further comprising:
establishing a termination resistance based, at least in part, on the selected ODT value.

16. The method of claim 15, further comprising:
preventing a reset of a state of the ODT activation signal for a predetermined period of time to allow for a time multiplexing of signals on the ODT pin.

17. A system comprising:
a first integrated circuit coupled to an interconnect; and
a second integrated circuit coupled to the first integrated circuit via the interconnect, the second integrated circuit including,
an input/output (I/O) circuit to receive a command from the interconnect,
a termination resistance circuit coupled with the I/O circuit, the termination resistance circuit to dynamically provide one of a plurality of termination resistances for the I/O circuit, and
control logic coupled with the termination resistance circuit, the control logic including preamble conditioning logic to establish an initial termination resistance, during a preamble associated with the command, wherein the control logic further comprises ODT value transition logic to transition the termination resistance circuit from a first selected ODT value to a second selected ODT value without powering down the termination resistance circuit.

18. The system of claim 17, wherein the preamble conditioning logic is to establish the initial termination resistance prior to determining a selected on-die termination value.

19. The system of claim 18, wherein the initial termination resistance is independent of the selected ODT value.

20. The system of claim 17, wherein the first integrated circuit comprises a memory controller.

21. The system of claim 17, wherein the second integrated circuit comprises a memory device.

* * * * *